(12) United States Patent
Tsai et al.

(10) Patent No.: US 12,549,131 B2
(45) Date of Patent: Feb. 10, 2026

(54) SWITCHED OSCILLATOR CIRCUIT

(71) Applicant: Nordic Semiconductor ASA, Trondheim (NO)

(72) Inventors: Cheng-Hsueh Tsai, Trondheim (NO); Henrik Fon, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/742,593

(22) Filed: Jun. 13, 2024

(65) Prior Publication Data

US 2024/0429864 A1 Dec. 26, 2024

(30) Foreign Application Priority Data

Jun. 22, 2023 (GB) ..................................... 2309458

(51) Int. Cl.
*H03B 5/12* (2006.01)
*H03B 5/04* (2006.01)
*H03B 5/32* (2006.01)
*H03B 5/36* (2006.01)

(52) U.S. Cl.
CPC ............... *H03B 5/124* (2013.01); *H03B 5/04* (2013.01); *H03B 5/32* (2013.01); *H03B 5/36* (2013.01); *H03B 2200/0044* (2013.01); *H03B 2200/0052* (2013.01); *H03B 2200/0082* (2013.01); *H03B 2201/0208* (2013.01)

(58) Field of Classification Search
CPC . H03B 5/124; H03B 5/04; H03B 5/32; H03B 2201/0208; H03B 2200/0044; H03B 2200/0052; H03B 2200/0082; H03B 5/36

USPC .......................... 331/117 R, 158, 34, 116 FE
See application file for complete search history.

(56) References Cited

U.S. PATENT DOCUMENTS

| | | | |
|---|---|---|---|
| 10,581,378 B1 * | 3/2020 | Verhoef | ............... H03K 3/0307 |
| 2015/0207460 A1 * | 7/2015 | Yoon | ........................ H03K 5/04 |
| | | | 331/158 |
| 2022/0103126 A1 | 3/2022 | Zhang | |

FOREIGN PATENT DOCUMENTS

EP     4087123     11/2022

OTHER PUBLICATIONS

Combined Search and Examination Report under Sections 17 and 18(3) for Great Britain Application No. 2309458.4, mailed Dec. 8, 2023 (5 pages).

* cited by examiner

*Primary Examiner* — Arnold M Kinkead
(74) *Attorney, Agent, or Firm* — Klarquist Sparkman, LLP (57) ABSTRACT

An oscillator circuit portion 200 including a resonator 216 arranged to oscillate with a resonant frequency, a capacitor 208 arranged to provide charge to the resonator, a first switch 206 arranged to connect the capacitor to an input voltage to charge the capacitor, a second switch 210 arranged to connect the resonator to the capacitor, and a timing circuit 202 configured to generate periodically a first pulse PULSE_L and a second pulse PULSE_H. The first pulse is configured to close the first switch, the second pulse is configured to close the second switch, and the first and second switches are arranged to be open when the timing circuit is not generating the first or second pulses, to maintain oscillation of the resonator.

13 Claims, 5 Drawing Sheets

SWITCHED OSCILLATOR CIRCUIT

CROSS REFERENCE TO RELATED APPLICATIONS

This application claims the benefit of Great Britain Application No. 2309458.4, filed Jun. 22, 2023. The priority application is incorporated by reference herein in its entirety.

BACKGROUND OF THE INVENTION

The present invention relates to oscillator circuits and methods of operating oscillator circuits.

Electronic oscillator circuits are commonly used in electronic devices to provide clock signals. In particular, crystal oscillators can be used to provide very stable clock signals due to their high Q factor and temperature stability. The crystal oscillator comprises a piezoelectric crystal (usually made of quartz) and a driving amplifier, which has its output fed back into its input via the crystal. The crystal oscillator acts as a very narrow filter, causing the circuit to oscillate at or near the resonant frequency of the crystal.

However, crystal resonators require much more power to operate than non-crystal oscillators (e.g. a tuned LC oscillator circuit), due to bias current consumption in the driving amplifier (which is continuously powered). This compensates for power loss due to the piezoelectric movement of the crystal, and resistive losses in the circuit.

To mitigate these power losses, it is known to use a pulse injection crystal oscillator (or PIXO), where the piezoelectric crystal is alternately connected to a supply voltage rail and a ground rail for short pulses, rather than continuously driving the crystal. The rate of the pulses is phase-locked to the resonance of the crystal, which ensures that the crystal continues to resonate without needing to continuously bias a driving amplifier.

However, generating the dedicated supply rail requires a powerful, low impedance regulator or buffer, making the instantaneous power requirements relatively high.

Figure 1:
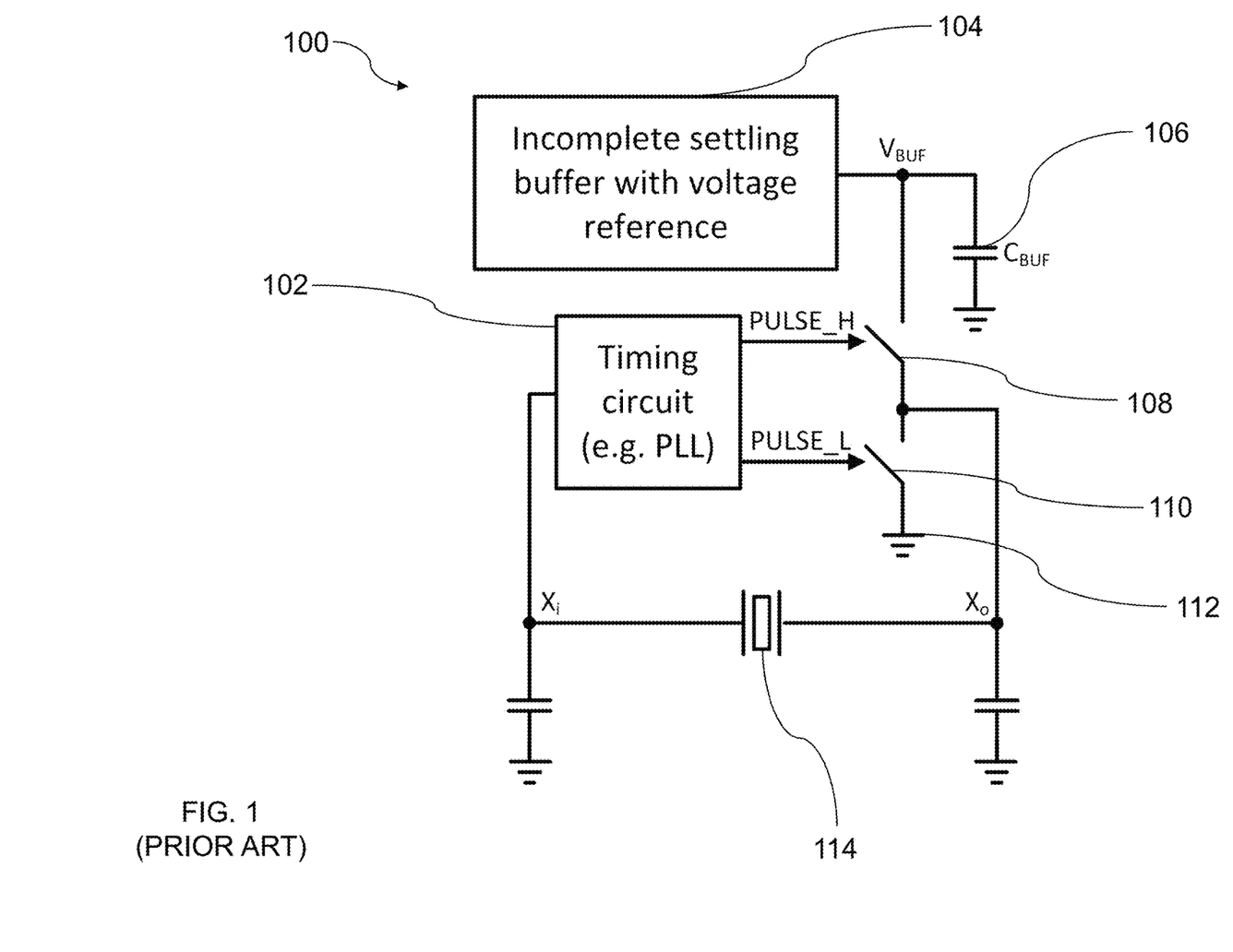
FIG. 1 is a schematic diagram of a pulse injection crystal oscillator circuit portion according to the prior art.

It has been proposed in EP 4 087 123 A1 demonstrates to charge the resonator only partially towards the input voltage, in order to reduce the power requirements, through use of biasing circuitry and buffer. FIG. 1 shows a pulse injection crystal oscillator circuit 100 (or PIXO) according to the prior art, in which a timing circuit 102 alternately connects a crystal oscillator 114 to a buffer and biasing circuitry 104 using a high switch 108 and to a ground rail 112 using a low switch 111, at a rate and phase which corresponds to the resonance of the crystal oscillator 114.

However, the Applicant has now recognised that the biasing circuitry and a buffer both continuously drain current from the supply leading to an overall high current consumption. Furthermore, as the buffer must have low-output impedance to quickly recharge after charging the resonator, a high voltage power voltage reference is required as well as a large buffer capacitance, which contributes to the aforementioned high current consumption. It is an object of the present invention to provide an alternative approach.

SUMMARY OF THE INVENTION

According to a first aspect of the present invention there is provided an oscillator circuit portion, comprising:
   a resonator arranged to oscillate with a resonant frequency;
   a capacitor arranged to provide charge to the resonator;
   a first switch arranged to connect the capacitor to an input voltage to charge the capacitor;
   a second switch arranged to connect the resonator to the capacitor; and
   a timing circuit configured to generate periodically a first pulse and a second pulse;
   wherein the first pulse is configured to close the first switch;
   wherein the second pulse is configured to close the second switch; and
   wherein the first and second switches are arranged to be open when the timing circuit is not generating the first or second pulses, to maintain the oscillation of the resonator.

According to a second aspect of the present invention there is provided a method of operating an oscillator circuit portion comprising:
   oscillating a resonator with a resonant frequency;
   using a capacitor to provide charge to the resonator;
   charging the capacitor from an input voltage;
   generating periodically a first pulse and a second pulse using a timing circuit;
   closing a first switch between the capacitor and the input voltage during the first pulse;
   closing a second switch between the resonator and the capacitor during the second pulse; and
   opening the first and second switches when the timing circuit is not generating the first or second pulses, maintaining the oscillation of the resonator.

It will therefore be seen by those skilled in the art that in accordance with the invention the capacitor is charged from the input voltage during the first pulse. The resonator is then charged from the capacitor during the second pulse. Outside of the duration of the second pulse, the second switch is open and hence no current is drawn by the oscillator circuit portion from the input voltage.

By driving the oscillator circuit portion by charging the resonator in regular pulses from the capacitor, the circuit may be operated in a 'discrete' manner such that current is not drawn continuously from the input voltage. The oscillation of the resonator may therefore be maintained (in an already oscillating state), whilst only drawing short pulses of current.

It will be understood by those skilled in the art that by only drawing current from the input voltage in short pulses, the overall power requirement of the oscillator circuit portion may be significantly reduced compared to other PIXO circuits. The complexity of the circuit may also be significantly reduced, as no buffer circuitry is required.

Compared to prior art proposals where an incomplete settling buffer drives the resonator, the embodiment of the invention may consume approximately half the current, and use over 10 times less area on an integrated circuit chip.

In a set of embodiments, a third switch is arranged between the resonator and ground. The third switch may be arranged to close during the first pulse, such that the resonator discharges to ground during the first pulse. This discharges the resonator such that the lowest point of the resonance of the resonator is at zero, such that the resonator resonates around the voltage valley point. This may stabilise the voltage output of the resonator and may boost the oscillation of the resonator. In some embodiments, the resonator may only partially discharge during the first pulse.

In some embodiments, the capacitor is fully charged to the same voltage as the input voltage during the first pulse. In other embodiments, the capacitor is only partially charged to the voltage of the input voltage during the first pulse. This may be achieved by adjusting the duration of the first pulse to be shorter than the time needed for the capacitor to fully charge. This may allow for a capacitor with a lower voltage rating to be used, and additionally may allow for the input voltage to be higher, whilst reducing the risk of overcharging the capacitor. This may be useful in embodiments where the input voltage is the main supply voltage of the integrated circuit.

After the first pulse, the first switch is opened and the capacitor is disconnected from the input voltage. Between the first and second pulses, when the first and second switches are both open, the capacitor is not connected to the rest of the oscillator circuit portion. In some embodiments, the other side of the capacitor is connected to ground.

When the second switch is closed, the charged capacitor is connected to the resonator. This allows for the capacitor to inject charge into the resonator, which injects a pulse of current into the resonator. The transferred charge during the pulse of current boosts the oscillation of the resonator.

In a set of embodiments, the resonator is partially charged by the capacitor during the second pulse. This may reduce the current drawn by the capacitor when it recharges, as it is not fully discharged during the second pulse.

After the second pulse, the second switch is opened and the resonator is disconnected from the capacitor. Between the first and second pulses, when the first and second switches are both open, the resonator is not connected to the capacitor.

In a set of embodiments, the resonator may oscillate at a frequency that is exactly an inherent resonant frequency of the resonator (e.g. a series resonant frequency).

However in some embodiments, due to process voltage and temperature variations, the resonator may oscillate at a slightly higher, or a slightly lower frequency near to the inherent resonant frequency.

In a set of embodiments, the first and second pulses are alternately generated at a rate corresponding to the oscillation of the resonator. This may comprise alternately generating the first and second pulses at a rate that is equal or near to the frequency of the resonator. However, the first and second pulses may alternatively be generated at a rate equal or near to an integer multiple or division of the frequency of the resonance of the resonator.

In a set of embodiments, the first and second pulses are generated with a phase corresponding to the oscillation of the resonator, e.g. the first and second pulses may be phase-locked (i.e. having a fixed phase relationship) to the oscillation of the resonator with appropriate phase relationships for maintaining the oscillation. This may comprise generating the first pulse at or close to a lowest point of the oscillation (e.g. approximately 90 degrees out of phase with a sinusoidal oscillation of the resonator), and/or generating the second pulse at or close to a peak of the oscillation (e.g. approximately 270 degrees out of phase with a sinusoidal oscillation of the resonator).

In a set of embodiments, the first and second pulses are controlled using a timing circuit comprising a feedback loop arranged to synchronise the first and second pulses with the oscillation of the resonator. In some embodiments, the timing circuit comprises a phase locked loop or a delay locked loop. The feedback loop may allow for accurate timing of the pulses for quick synchronisation with the oscillation of the resonator.

In a set of embodiments, the oscillation circuit is implemented on an integrated circuit, and the input voltage which charges the capacitor is a main supply of the integrated circuit. This avoids the need for a dedicated low-impedance PIXO supply, whilst also potentially significantly reducing the current consumption of the oscillator circuit portion compared to other PIXO circuits. Additionally, the area required on the integrated circuit by the oscillator circuit portion may be significantly reduced, as no buffer circuits are required.

As the main supply voltage of the integrated circuit is typically inherently low-impedance with a large voltage, the capacitance of the capacitor may be reduced, and hence overall current consumption by the oscillator circuit portion may be reduced. For example, the capacitance of the capacitor may be reduced from around 1.4 pF in pulsed mode oscillator circuits in the prior art, to 50 fF in an embodiment of the present invention.

This has the additional advantage of only a small on-chip capacitor being required for the oscillator circuit portion, further saving space on the integrated circuit.

Embodiments of the present invention may be used with many different types of resonator, such as electronic circuits (e.g. an RC circuit or a tuned LC circuit) or dielectric resonators. However, in a preferred set of embodiments, the resonator comprises a piezoelectric material, for instance a quartz crystal. Piezoelectric resonators typically have a high Q factor and good temperature stability, allowing for excellent frequency stability. However, piezoelectric resonators can require more power to operate than other types of resonator, thus making them particularly suited to the power-saving benefits which may be achieved in accordance with the present invention.

In some embodiments, the piezoelectric crystal resonator also comprises a pair of load capacitors, with the input of the crystal resonator connected to a first load capacitor, and the output of the crystal resonator connected to a second load capacitor. Each load capacitor may be connected to ground at its other side. The addition of load capacitors may allow for a precise oscillation frequency of the resonator to be selected.

The charging of the resonator is typically dependent on the capacitance of the capacitor it is connected to during the second pulse. Therefore, the drive strength of the pulse injections that drive the crystal are easily adjustable by changing the capacitance of the capacitor. In a set of embodiments, the capacitor is a variable capacitor.

Some embodiments may comprise providing an initial resonance signal to start oscillations of the oscillator circuit portion from an initial zero oscillation state (i.e. a start-up signal to cold-start the oscillator circuit portion). The oscillation circuit may otherwise only be able to maintain oscillations, not initiate them. The initial resonance signal may be provided from an external source, but in at least some embodiments the oscillator circuit portion comprises a start-up circuit arranged to provide an initial resonance signal to initiate operation of the oscillator circuit portion. The start-up circuit may comprise a Pierce oscillator. Providing an initial resonance signal to start-up the resonance may be particularly beneficial in embodiments where the timing of the first and second pulses is controlled using the resonance of the resonator itself (e.g. embodiments featuring a timing circuit that receives an oscillation signal from the resonator as an input).

The first pulse may have a duration on the order of microseconds. The first and second pulses may have approximately or fully equal durations. This may simplify the circuitry required to time the first and second pulses, e.g. allowing common timing components to be used to time the first and second pulses.

Alternatively, the first and second pulses may have different durations. This may allow for the power consumption and/or size of the oscillator circuit portion to be further optimised. For instance, the second pulse may be longer than the first pulse, e.g. where circuitry used to discharge the resonator has a higher bandwidth than the circuitry used to charge the resonator. Conversely, the second pulse may be shorter than the first pulse.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

One or more non-limiting examples will now be described, by way of example only, and with reference to the accompanying figures in which.

DETAILED DESCRIPTION

FIG. 1 shows a pulse injection crystal resonator circuit 100 according to the prior art, in which a timing circuit 102 alternately connects a crystal resonator 114 to a buffer circuit 104 (including a buffer capacitor 106) using a high switch 108 and to a ground rail 112 using a low switch 111, at a rate and phase which corresponds to the resonance of the crystal resonator 114.

When the crystal resonator 114 is connected to the buffer circuit 104, it is charged partially towards the buffer voltage $V_{BUF}$ through the discharging of the buffer capacitor 106. When the high switch 108 is open, the buffer capacitor 106 recharges back to the buffer voltage $V_{BUF}$. When the crystal resonator 114 is connected to the ground rail 112, the crystal resonator 114 is quickly discharged. The buffer circuit 104 continuously draws current from the supply, leading to an overall high current consumption.

Figure 2:
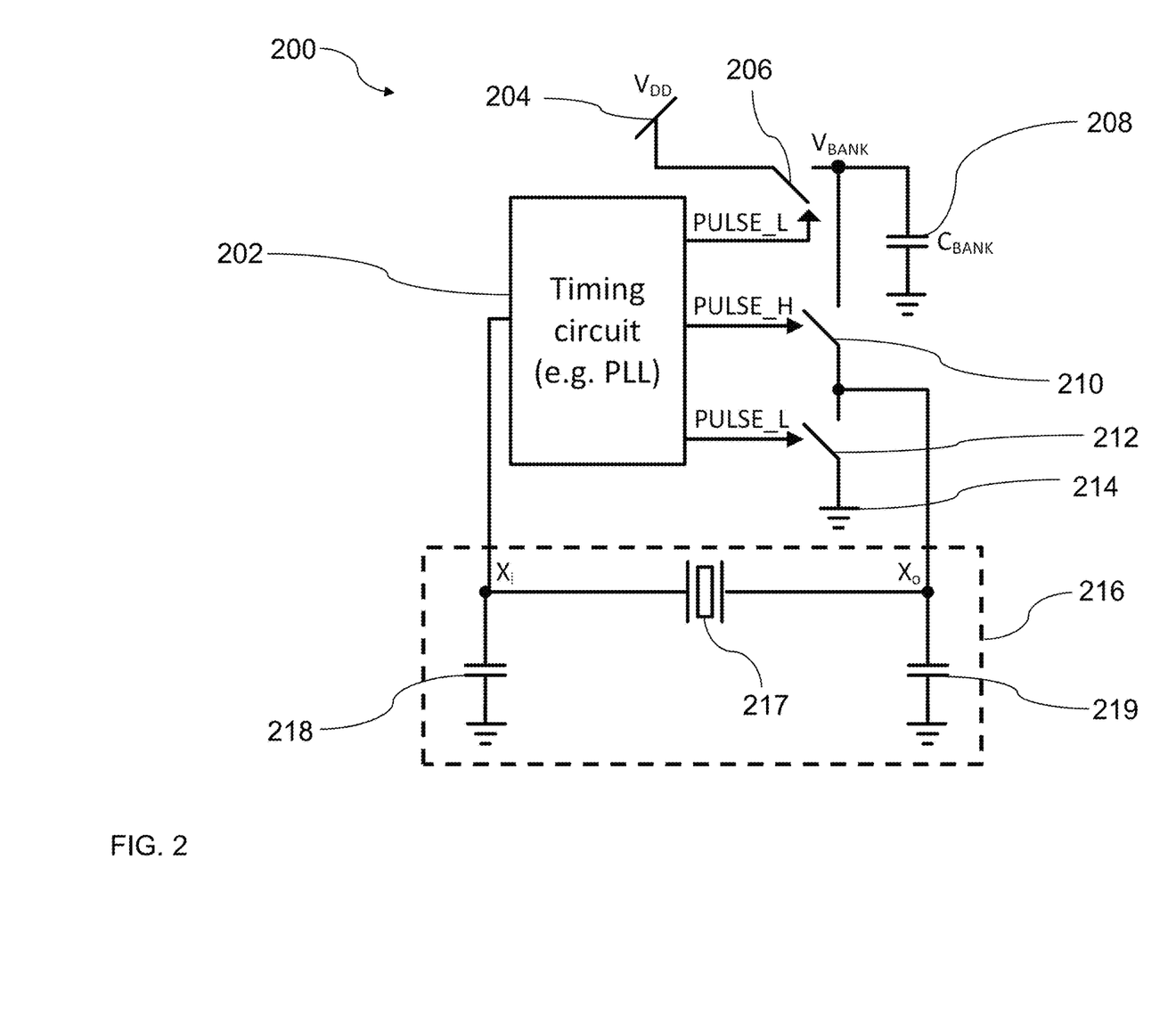
FIG. 2 is a schematic diagram of a pulse injection crystal oscillator circuit portion according to an embodiment of the invention.

FIG. 2 shows a pulse injection crystal resonator circuit 200 embodying the invention. The crystal resonator circuit 200 comprises a piezoelectric crystal resonator 216, a capacitor 208, a timing circuit 202, a first switch 206 and a second switch 210. The crystal resonator 216 comprises a crystal 217, with a first load capacitor 218 connected at the input of the crystal 217, and a second load capacitor 219 connected at the output of the crystal 217. The first switch 206 connects the capacitor to an input voltage 204, and the second switch 210 connects the capacitor to the crystal resonator 216. The timing circuit 202 generates pulses to control the first and second switches 206, 210, which is explained in further detail below.

The operation of the pulse injection crystal resonator circuit 200 will now be described with reference to the timing diagram shown in FIG. 3. In use, the timing circuit 202 alternately connects the capacitor 208 to the input voltage 204 using the first switch 206 and to the crystal resonator 216 using the second switch 210.

The timing circuit 202 also alternately connects the crystal resonator 216 to the capacitor 208 using the second switch 210 and to a ground rail 214 using a third switch 212, at a rate that corresponds to a resonance of the crystal resonator 216, and with a phase corresponding to the resonance of the crystal resonator 216. The first switch 206 and third switch 212 are controlled by the timing circuit 202 to open and close at the same time as each other.

Therefore, no buffer circuit is required between the main voltage supply of the integrated circuit 204 which is at a voltage $V_{DD}$, due to the first switch 206 being opened and closed such that the capacitor 208 is only intermittently connected to the voltage supply 204.

Figure 3:
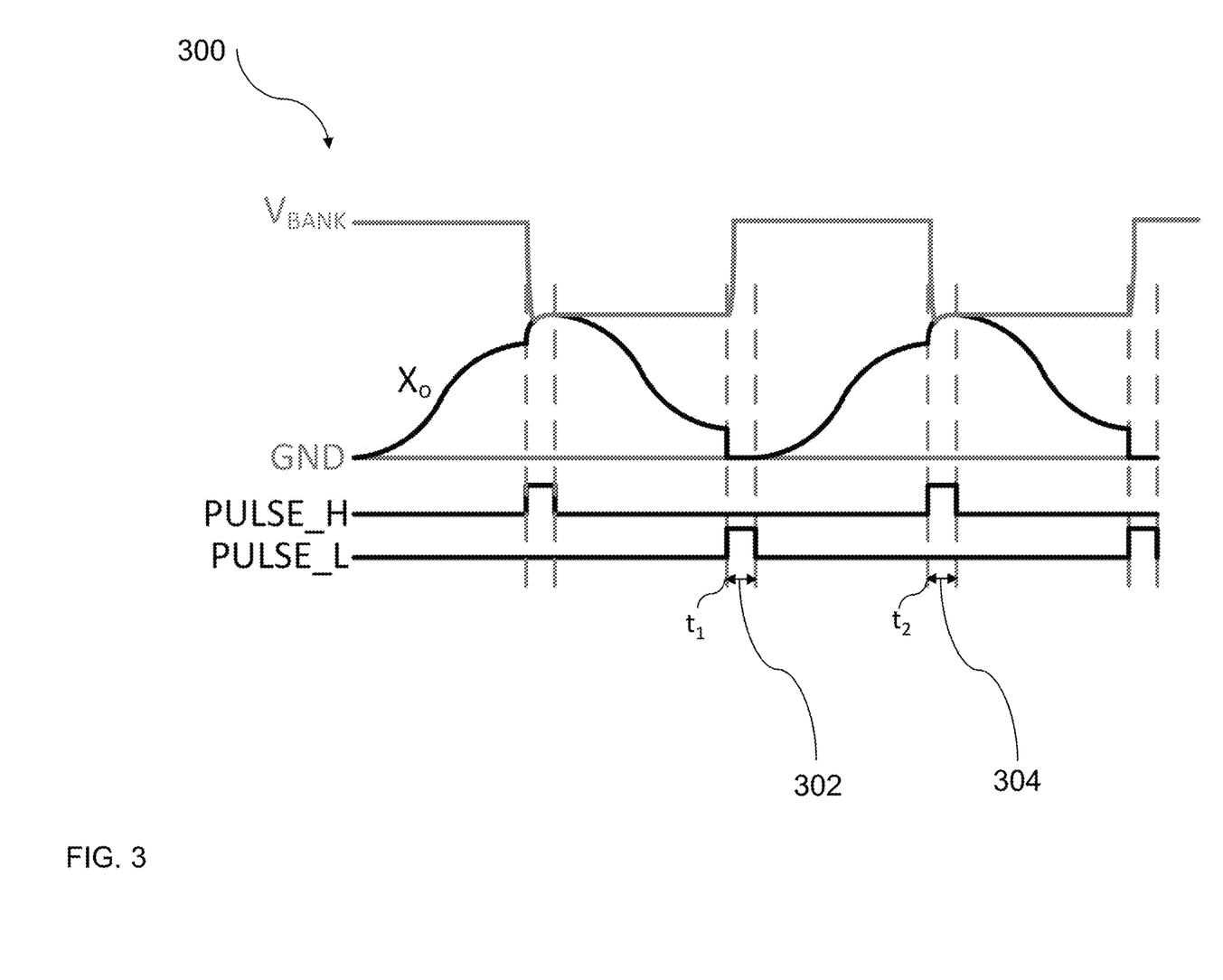
FIG. 3 is a timing diagram illustrating the operation of the pulse injection crystal oscillator circuit portion shown in FIG. 2.

As shown in FIG. 3, the voltage of the crystal resonator 216, measured at node $X_o$ oscillates at the frequency of the resonance of the crystal resonator 216. The timing circuit 202 is locked to the resonance of the crystal resonator 216 (e.g. using a phase locked loop), which is explained in more detail below with reference to FIG. 4.

At a first time $t_1$, the timing circuit 202 closes the first switch 206 to connect the capacitor 208 to the input voltage 204 for the first pulse period 302, which is at the supply voltage $V_{DD}$. This charges the capacitor 208 to the supply voltage $V_{DD}$. This is seen in FIG. 3, where the voltage $V_{BANK}$ is low before the first time $t_1$ and after the second time $t_2$ as the capacitor has been discharged to the crystal resonator, and high after the first pulse period 302 as the capacitor has been charged.

At the end of the first pulse period 302 the timing circuit 202 opens the first switch 206 to disconnect the capacitor 208 from the supply voltage $V_{DD}$. Therefore current only flows between the input voltage 204 and the capacitor 208 during the first pulse period 302.

At the second time $t_2$ (i.e. at the beginning of the second pulse period 304), which is half of the resonant period of the crystal resonator 216 after $t_1$, the timing circuit 202 closes the second switch 210 to connect the crystal resonator 216 to the capacitor 208, which is at a voltage of $V_{BANK}$. This is the 'charge sharing' phase, where during the second pulse period 304 the charge from the capacitor quickly moves to the crystal resonator 216. The voltage of the capacitor $V_{BANK}$ decreases during the second pulse period 304 as the charge is shared between the crystal resonator 216 and the capacitor 208.

At the end of the second pulse period 304 the timing circuit 202 opens the second switch 210 to disconnect the crystal resonator 216 from the capacitor 208.

Also at the first time $t_1$ which is half of the resonant period of the crystal resonator 216 after $t_2$, the timing circuit 202 closes the third switch 212 to connect the crystal resonator 216 to the ground rail 214 for the first pulse period 302. This quickly discharges the crystal resonator 216. Whilst in the example shown in FIG. 3 the crystal resonator 216 is completely discharged in the first pulse period 302, this is not essential.

At the end of the first pulse period 302 the timing circuit 202 opens the first and third switches 206, 212 to disconnect the crystal resonator 216 from the ground rail 214, and the capacitor 208 from the input voltage 204.

The duration of the second pulse period 304 and the capacitance $C_{BANK}$ of the capacitor 208 are chosen to ensure that the charge delivered to the crystal resonator 216 is sufficient to keep the oscillation going, whilst minimising the size of the capacitor 208. The duration of the first pulse period 302 is chosen to ensure that the capacitor 208 is only charged for as long as is necessary, to avoid excessive current usage, whilst also ensuring the there is enough time for the crystal resonator 216 to discharge.

FIG. 3 also shows the first and second pulse periods 302, 304 as equal, but again this is not essential. For instance, the second pulse period 304 may be shorter than the first pulse period 302. Alternatively, the first pulse period 302 may be shorter than the time for the capacitor to fully charge. In this example, at the end of the first pulse period 302, the voltage of the capacitor $V_{BANK}$ is less than the supply voltage $V_{DD}$.

The output $X_i$ of the crystal resonator 216 is connected to the timing circuit 202, which controls the process to repeat at a rate corresponding to the resonance of the crystal resonator 216 and which is phase-locked with the resonance of the crystal resonator 216 (i.e. with the second pulse period 304 occurring at or close to the peak of the oscillation waveform, and the first pulse period 302 occurring at or close to the bottom of the oscillation waveform). This maintains the oscillation indefinitely.

Figure 4:
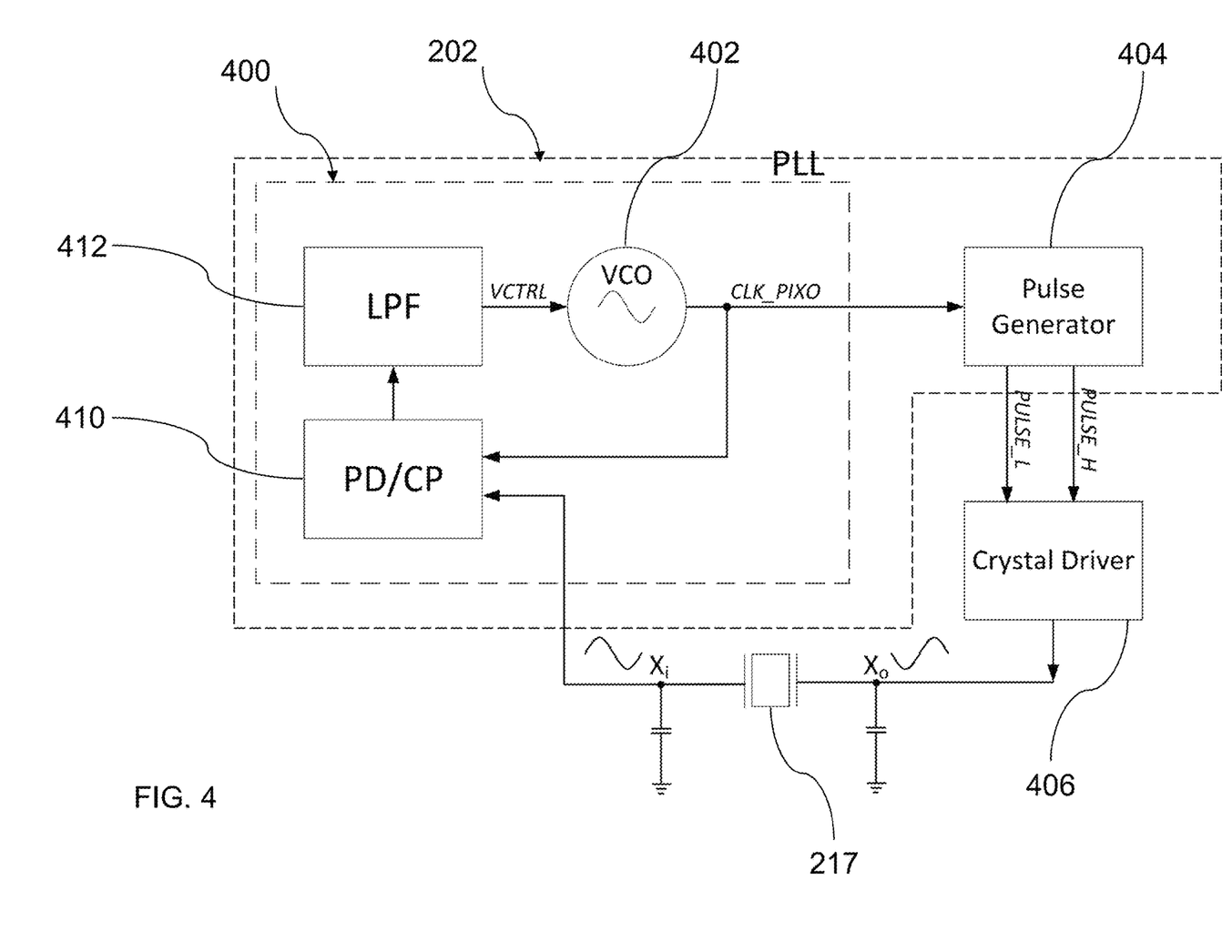
FIG. 4 is a schematic diagram of an embodiment of the pulse injection crystal oscillator circuit portion shown in FIG. 2.

FIG. 4 is a schematic diagram of a phase locked loop circuit 400 which provides part of the timing circuit 202. The phase locked loop circuit 400 is a feedback circuit, and comprises a phase detector and charge pump 410, which is connected to the output $X_i$ of the crystal resonator 217.

The phase detector and charge pump 410 detects the frequency and phase of the voltage at the output $X_i$ of the crystal 217, by comparing the phases of the output at $X_i$ of the crystal 217, and the output of a voltage controlled oscillator 402. The phase detector and charge pump 410 then generates an error signal corresponding to the phase difference between these input signals.

The error signal is then passed to a low-pass filter 412, which removes any high-frequency elements from the error signal, and filters the error signal into a DC signal, to produce a filtered error signal with a voltage VCTRL proportional to the differences between the phases of the input signals to the phase detector and charge pump 410.

The filtered error signal VCTRL is then passed to the voltage controlled oscillator 402. The voltage controlled oscillator 402 receives the filtered error signal VCTRL and adjusts its frequency towards the frequency of the output voltage $X_i$ of the crystal 217 based on the voltage of the filtered error signal VCTRL.

The output of the voltage controlled oscillator 402 is then fed back into the phase detector and charge pump 410, and the feedback cycle repeats. Eventually, the phase difference between the output of the voltage controlled oscillator 402 and the output voltage $X_i$ of the crystal 217 is zero, such that they are operating at the same frequency. At this point, the phase locked loop circuit 400 is 'locked' and the voltage of the filtered error signal VCTRL is in a steady-state.

The output CLK_PIXO of the voltage controlled oscillator 402 is a signal with the same frequency and phase as the crystal 217. This is fed into a pulse generator 404, which generates a first pulse PULSE_L and a second pulse PULSE_H. This allows for the first pulse PULSE_L to be generated at the bottom of the oscillation waveform of the crystal 217 measured at the crystal input $X_O$ and the second pulse PULSE_H to be generated at the peak of the oscillation waveform of the crystal 217 measured at the crystal input $X_O$. Therefore, the pulses repeat at a rate and phase corresponding to the resonance of the crystal 217 in order to maintain its oscillation.

The pulses PULSE_L and PULSE_H are passed to a crystal driver portion 406 which represents the switches and capacitors 206, 208, 210, 212 of the pulse injection crystal resonator circuit 200 shown in FIG. 2. With reference to FIGS. 2 and 3, the first pulse PULSE_L controls the first and third switches 206, 212 during the first pulse period 302, and the second pulse PULSE_H controls the second switch 210 during the second pulse period 304. As explained with reference to FIG. 2, these components then allow for control of the oscillation of the crystal 217 at the crystal input $X_O$.

Figure 5:
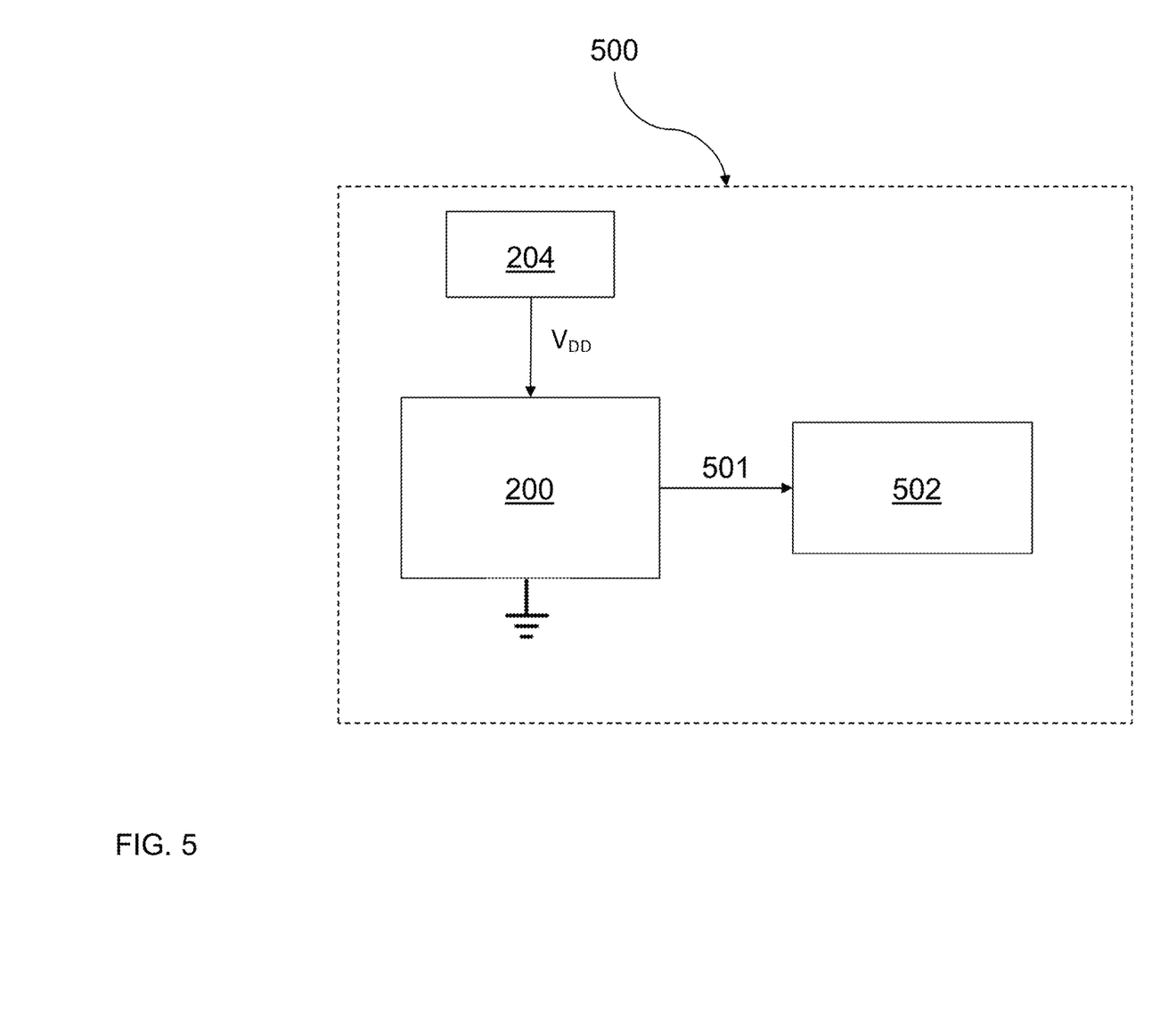
FIG. 5 is a schematic diagram of an embodiment of the pulse injection crystal oscillator circuit portion shown in FIG. 2 implemented on an integrated circuit chip.

The oscillator circuit described with reference to the Figures above may be implemented to provide a stable clock signal for other components on an integrated circuit. This is shown in FIG. 5. The integrated circuit 500 comprises the crystal resonator circuit 200, which receives an input voltage $V_{DD}$ from the main supply voltage 204 of the integrated circuit. The output of the crystal resonator circuit 200 provides a clock signal 501 to a clock domain 502 on the integrated circuit 500.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. An oscillator circuit portion, comprising:
 a resonator arranged to oscillate with a resonant frequency;
 a capacitor arranged to provide charge to the resonator;
 a first switch arranged to connect the capacitor to an input voltage to charge the capacitor;
 a second switch arranged to connect the resonator to the capacitor;
 a third switch arranged to connect the resonator to ground; and
 a timing circuit configured to generate periodically a first pulse and a second pulse;
 wherein the first pulse is configured to close the first switch;
 wherein the second pulse is configured to close the second switch;
 wherein the first and second switches are arranged to be open when the timing circuit is not generating the first or second pulses, to maintain the oscillation of the resonator; and
 wherein the first pulse is configured to close the third switch.

2. The oscillator circuit portion of claim 1, wherein the resonator is arranged to partially discharge during the first pulse.

3. The oscillator circuit portion of claim 1, wherein the timing circuit is arranged to repeat the first and second pulses at a rate corresponding to the oscillation of the resonator, and with a phase corresponding to the oscillation of the resonator.

4. An integrated circuit comprising the oscillator circuit portion of claim 1, wherein the input voltage of the oscillator circuit is a voltage supply of the integrated circuit.

5. An oscillator circuit portion, comprising:
 a resonator arranged to oscillate with a resonant frequency;
 a capacitor arranged to provide charge to the resonator;
 a first switch arranged to connect the capacitor to an input voltage to charge the capacitor;
 a second switch arranged to connect the resonator to the capacitor; and a timing circuit configured to generate periodically a first pulse and a second pulse;
wherein the first pulse is configured to close the first switch;
wherein the second pulse is configured to close the second switch;
wherein the first and second switches are arranged to be open when the timing circuit is not generating the first or second pulses, to maintain the oscillation of the resonator; and
wherein the capacitor is arranged to partially charge the resonator during the second pulse.

6. An oscillator circuit portion, comprising:
a resonator arranged to oscillate with a resonant frequency;
a capacitor arranged to provide charge to the resonator;
a first switch arranged to connect the capacitor to an input voltage to charge the capacitor;
a second switch arranged to connect the resonator to the capacitor; and
a timing circuit configured to generate periodically a first pulse and a second pulse;
wherein the first pulse is configured to close the first switch;
wherein the second pulse is configured to close the second switch;
wherein the first and second switches are arranged to be open when the timing circuit is not generating the first or second pulses, to maintain the oscillation of the resonator; and
wherein the capacitor is arranged to partially charge during the first pulse.

7. An oscillator circuit portion, comprising:
a resonator arranged to oscillate with a resonant frequency;
a capacitor arranged to provide charge to the resonator;
a first switch arranged to connect the capacitor to an input voltage to charge the capacitor;
a second switch arranged to connect the resonator to the capacitor; and
a timing circuit configured to generate periodically a first pulse and a second pulse;
wherein the first pulse is configured to close the first switch;
wherein the second pulse is configured to close the second switch;
wherein the first and second switches are arranged to be open when the timing circuit is not generating the first or second pulses, to maintain the oscillation of the resonator; and
wherein the capacitor is a variable capacitor.

8. The oscillator circuit portion of claim 1, wherein the resonator comprises a piezoelectric crystal with an input and an output, wherein the input is arranged to connect to a first load capacitor and the output is arranged to connect to a second load capacitor.

9. The oscillator circuit portion of claim 1, wherein the timing circuit comprises a feedback loop configured to synchronise the first and second pulses with the resonance of the resonator.

10. The oscillator circuit portion of claim 1, wherein the timing circuit is a phase locked loop or a delay locked loop.

11. A method of operating an oscillator circuit portion comprising:
oscillating a resonator with a resonant frequency;
using a capacitor to provide charge to the resonator;
charging the capacitor from an input voltage;
generating periodically a first pulse and a second pulse using a timing circuit;
closing a first switch between the capacitor and the input voltage during the first pulse;
closing a second switch between the resonator and the capacitor during the second pulse;
opening the first and second switches when the timing circuit is not generating the first or second pulses, maintaining the oscillation of the resonator; and
closing a third switch between the resonator and ground during the first pulse.

12. The method of claim 10, comprising generating the first and second pulses at a rate corresponding to the oscillation of the resonator, and with a phase corresponding to the oscillation of the resonator.

13. A method of operating an integrated circuit comprising an oscillator circuit, the method comprising:
oscillating a resonator with a resonant frequency;
using a capacitor to provide charge to the resonator;
charging the capacitor from a voltage supply of the integrated circuit;
generating periodically a first pulse and a second pulse using a timing circuit;
closing a first switch between the capacitor and the voltage supply during the first pulse;
closing a second switch between the resonator and the capacitor during the second pulse;
opening the first and second switches when the timing circuit is not generating the first or second pulses, maintaining the oscillation of the resonator; and
closing a third switch between the resonator and ground during the first pulse.

* * * * *